(12) United States Patent
Pelley et al.

(10) Patent No.: US 9,208,024 B2
(45) Date of Patent: Dec. 8, 2015

(54) MEMORY ECC WITH HARD AND SOFT ERROR DETECTION AND MANAGEMENT

(71) Applicant: Freescale Semiconductor, Inc., Austin, TX (US)

(72) Inventors: Perry H. Pelley, Austin, TX (US); George P. Hoekstra, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 87 days.

(21) Appl. No.: 14/152,926

(22) Filed: Jan. 10, 2014

(65) Prior Publication Data

US 2015/0199233 A1    Jul. 16, 2015

(51) Int. Cl.
| | | |
|---|---|---|
| G06F 11/10 | (2006.01) | |
| G06F 11/07 | (2006.01) | |
| G11C 29/00 | (2006.01) | |
| G11C 15/00 | (2006.01) | |
| G11C 29/42 | (2006.01) | |

(52) U.S. Cl.
CPC .......... *G06F 11/1076* (2013.01); *G06F 11/073* (2013.01); *G11C 29/76* (2013.01); *G11C 15/00* (2013.01); *G11C 29/42* (2013.01)

(58) Field of Classification Search
CPC ............ G06F 11/1048; G06F 11/0721; G06F 11/106; G06F 11/0751; G06F 11/1076; G06F 11/073; G11C 15/00; G11C 29/4401; G11C 29/808; G11C 29/00; G11C 29/42; G11C 29/76
USPC .......................................................... 714/764
See application file for complete search history.

(56) References Cited

U.S. PATENT DOCUMENTS

| | | | |
|---|---|---|---|
| 4,475,194 A * | 10/1984 | LaVallee et al. | 714/710 |
| 6,711,703 B2 * | 3/2004 | MacLaren et al. | 714/704 |
| 7,190,617 B1 * | 3/2007 | Harari et al. | 365/185.11 |
| 7,304,875 B1 * | 12/2007 | Lien et al. | 365/49.1 |
| 7,386,771 B2 | 6/2008 | Shuma | |
| 7,644,341 B2 | 1/2010 | Huang | |
| 8,095,836 B2 | 1/2012 | Eguchi et al. | |
| 8,180,969 B2 | 5/2012 | Moyer | |
| 8,402,327 B2 | 3/2013 | Pelley, III et al. | |
| 8,689,081 B2 * | 4/2014 | Yu et al. | 714/764 |
| 2005/0081093 A1 * | 4/2005 | Joly et al. | 714/8 |
| 2009/0063914 A1 * | 3/2009 | Owsley et al. | 714/718 |
| 2009/0132876 A1 * | 5/2009 | Freking et al. | 714/723 |
| 2010/0107037 A1 | 4/2010 | Pelley, III et al. | |
| 2011/0041016 A1 * | 2/2011 | O'Connell | 714/711 |
| 2013/0139033 A1 * | 5/2013 | Yu et al. | 714/766 |

OTHER PUBLICATIONS

Volker Schober et al, Memory Built-in Self-Repair using redundant words, IEEE 2001 International Test Conference Proceedings, Oct. 30, 2001-Nov. 1, 2001.
John Wuu et al., The Asynchronous 24MB On-Chip Level-3 Cache for a Dual-Core Itanium-Family Processor, IEEE International Solid-State Circuits Conference, Session 26, Static Memory 26.8, 2005.

* cited by examiner

*Primary Examiner* — James C Kerveros
(74) *Attorney, Agent, or Firm* — Terrile, Cannatti, Chambers & Holland, LLP; Michael Rocco Cannatti (57) ABSTRACT

A method and apparatus are provided for error correction of a memory by using a first memory (18) and second memory (14) to perform error correction code (ECC) processing on data retrieved from the first memory and to use status control bits (35-37) in the second memory to detect and manage hard and soft errors identified by the ECC processing.

20 Claims, 4 Drawing Sheets

FIG. 1

| ADDRESS | VALID BIT | DATA | VALID BIT | WRITE BIT | READ BIT | PERMANENT BIT |
|---|---|---|---|---|---|---|
| 31 | 32 | 33 | 34 | 35 | 36 | 37 |
| ... | ... | ... | ... | ... | ... | ... |
| 41 | 42 | 43 | 44 | 45 | 46 | 47 |

MEMORY ECC WITH HARD AND SOFT ERROR DETECTION AND MANAGEMENT

BACKGROUND OF THE INVENTION

1. Field of the Invention

The present invention is directed in general to memory devices and methods for operating same. In one aspect, the present invention relates to memory systems having error correction and methods of operating those systems.

2. Description of the Related Art

Error correction code (ECC) can be used to correct bit errors that can be randomly caused by soft error events, such as arise from alpha particle or other high energy particle memory impact. In this area, the soft error rate (SER) is the rate at which a device or system encounters or is predicted to encounter soft errors. ECC memory designs provide a type of computer data storage that can detect and correct single bit failures. Now as technology continues to scale, bit cell degeneration increases over time due to latent defects, resulting in more severe SER and limited memory reliability. In addition, conventional ECC memory designs cannot correct a hard failure at a data element for a soft error hit using single bit correction techniques. To correct such combinations of hard and soft errors, more complex and costly multi-bit error correction is required, but at the expense of increased die size and operational latency. When multi-bit error correction is not available, a word that has two bits with errors is nearly always uncorrectable. Uncorrectable errors create a significant problem in system operation, and they should therefore be very infrequent and preferably never occur. The situation where two bit errors have a significantly increased likelihood is where a single bit error in a particular word is recurring. If a word has a bit that has failed on a continuous basis, then when a random error occurs in that word, there are two bits in the word that need correcting which is not likely to be possible. When such an event occurs, there is a significant cost to system operation.

One ECC technique addresses this issue by writing back the data to the memory location whenever an error has been detected, and then reading the memory location again to see if the error is repeated. If it is repeated, then the error is corrected by redundancy, i.e., the data from that memory location is stored elsewhere in spare memory. This can be effective to some extent, but some bit errors arise with weak bits that are leaky, pattern sensitive, or power supply sensitive bits. Such bit errors are difficult to detect because, when corrected data is written back, the bit cells can hold data for a period of time and be tested good, but still fail over time. This can be particularly true in a high temperature environment where leakage causes a failure. The high temperature raises the leakage so a failure soon occurs, but not soon enough to be found by the test after re-writing the data. Also, this re-writing of the data and subsequent testing is likely to be disruptive to system operation. As a result, the existing solutions for detecting and correcting a combination of hard failures, leaky bits, and SER correction without resorting to multi-bit error correction is extremely difficult at a practical level.

BRIEF DESCRIPTION OF THE DRAWINGS

The present invention may be understood, and its numerous objects, features and advantages obtained, when the following detailed description is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

In this disclosure, an improved ECC memory system, method, and apparatus are described that address various problems in the art where various limitations and disadvantages of conventional solutions and technologies will become apparent to one of skill in the art after reviewing the remainder of the present application with reference to the drawings and detailed description provided herein. In selected embodiments, an ECC memory system is described which uses a content addressable memory (CAM) and a main memory to provide hard and soft error detection and management. The CAM is used as a redundant memory for use in replacing locations in main memory that have been found to be defective, and includes storage for holding address and data, along with additional status bits (Write, Read, and Permanent) and a pointer to the first unused or least recently used (LRU) entry. Once found defective by one or more failures detected by ECC or other similar logic, the memory location is replaced with an entry in the CAM so that reading from the memory location is replaced by reading from the CAM entry. When an error is detected, the address of the memory location and the corrected data are entered in the CAM at the LRU entry identified by the CAM pointer. In addition, the Write status bit is set, while the Read status bit and the Permanent status bit remain reset. A subsequent read operation to an address that hits the CAM will provide CAM data in the place of array data until an error is proven to be soft (with valid data rewritten into the array for normal use). To detect such soft errors, CAM data entries having the Write status bit set are periodically written to the corresponding address in the array, at which point the Write status bit and Read status bit for the corresponding data entry in the CAM is reset and set, respectively. After a predetermined delay from writing the CAM data entry which is sufficient to allow weak bits to fail, data for CAM entries with the Read status bit set are read from the array using the CAM address. Subsequently, the Read status bits are reset and the read array data is compared to the CAM data. If the data comparison does not match after the delayed comparison, the Permanent status bit is set so that the data will always be read from the CAM. If the data comparison matches, this indicates that a soft error occurred, in which case the Read, Write and Permanent status bits remain reset, and the address remains in the CAM until it is the least recently used entry and replaced. Finally, if there is a CAM hit to an address previously stored in the array at any time (regardless of the condition of the Read or Write status bits), the Permanent status bit is set and the Read and Write status bits are cleared. As a result, any data entries with the Permanent status bit set are always read from the CAM. In this way, the Write, Read, and Permanent status bits are configured in the CAM to handle a combination of hard failures, weak bits, and soft error corrections without resorting to multiple bit error correction code techniques.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams and flow charts illustrating design and operational details of a memory device without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. Some portions of the detailed descriptions provided herein are also presented in terms of algorithms and instructions that operate on data that is stored in a computer memory. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices. In addition, the terms "assert" or "set" and "negate" (or "deassert" or "clear" or "reset") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
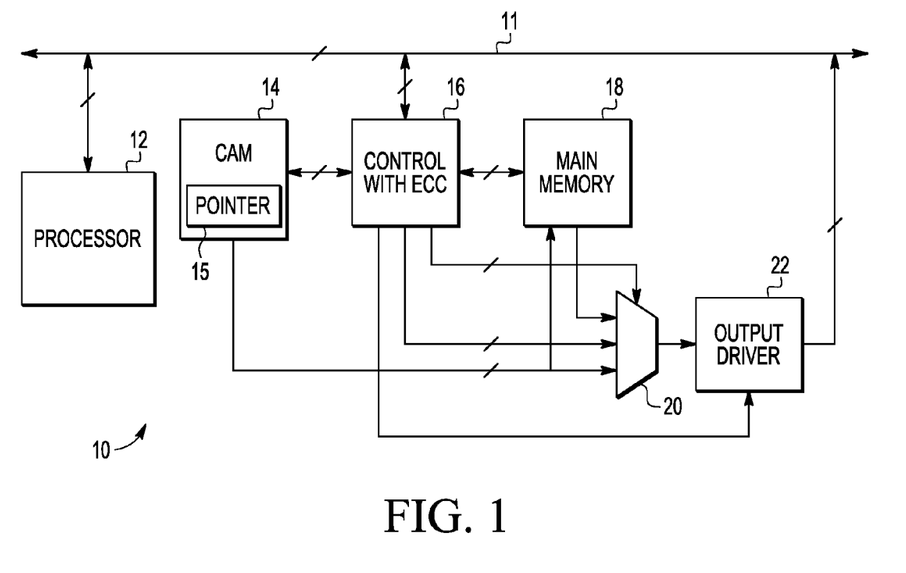
FIG. 1 illustrates a simplified block diagram of an ECC memory system in accordance with selected embodiments of the present disclosure.

Turning now to FIG. 1, there is shown a simplified block diagram of an ECC memory system 10 in accordance with selected embodiments of the present disclosure. The disclosed ECC memory system 10 includes a system interconnect 11, a processor 12 coupled to system interconnect 11, a content addressable memory (CAM) 14 having a pointer for identifying the first unused or least recently used (LRU) entry, a control circuit 16 coupled to system interconnect 11 and CAM 14, a main memory array 18 coupled to control circuit 16 and CAM 14, a multiplexer 20 coupled to CAM 14, control circuit 16, and main memory array 18, and an output driver 22 coupled to multiplexer 20 and control logic 16. Main memory array 18 is preferably organized in rows and columns to be addressed for read and write operations. Control circuit 16 includes circuitry for running error correction code (ECC). Control circuit 16 controls operation of CAM 14, main memory array 18, multiplexer 20, and output driver 22 in response to instructions provided by processor 12 through system interconnect 11. In performing a read at an address in which there is a location in main memory array 18 that corresponds to the address, generally the data is provided from main memory at the address location. Error correction is performed as needed. Also, the first time error correction is performed on data at a particular address, the address and corrected data is loaded into CAM 14. The location in CAM 14 replaces the location in main memory for reading and writing. Data is presented to multiplexer 20 from main memory array 18 in the most common case, from control circuit 16 when error correction is performed, and from CAM 14 when the data to be provided is from a location in CAM that has replaced a location in main memory array 18. Output driver 22 receives the data presented to multiplexer 20 as selected by control logic 16. Output driver 22 outputs the received data to system interconnect 11. Data may be retrieved from main memory array 18 in rows but a data location for correcting and storing in CAM 14 can be less than a whole row of main memory array 18 to avoid making CAM 14 unnecessarily large.

Figure 2:
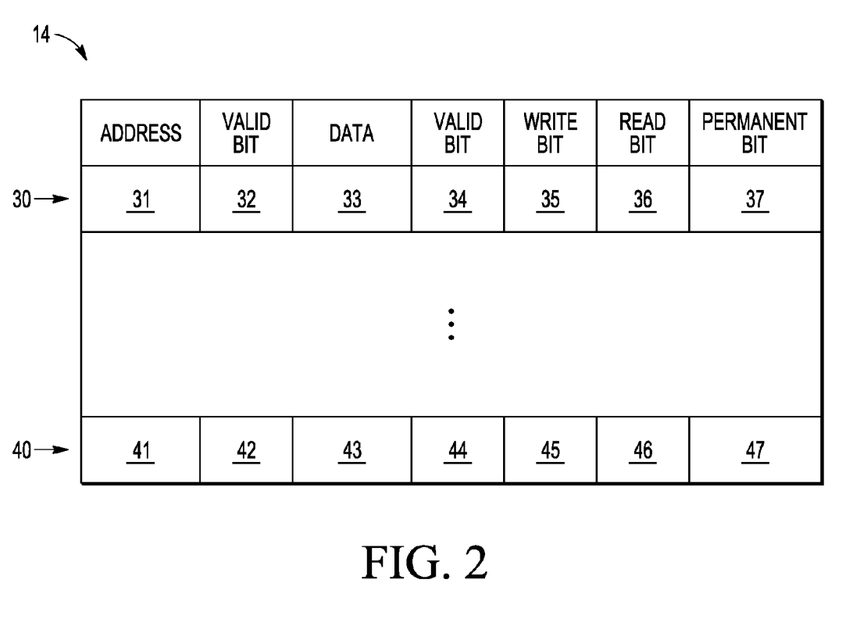
FIG. 2 illustrates a simplified block diagram of a portion of the ECC memory system of FIG. 1 in more detail.

FIG. 2 illustrates a simplified block diagram of the CAM 14 in the ECC memory system of FIG. 1 in which a plurality of entries 30, 40 is stored. Each entry of the plurality of entries has a plurality of fields, including at least an address field, data field, write bit status field, read bit status field, and permanent bit status field. For example, the first entry 30 includes an address field 31 for storing an address; a first valid bit field 32 for storing a valid bit for indicating whether the address stored in address location 31 is valid; a data field 33 for storing data; a second valid bit field 34 for storing a valid bit indicating the data stored in the data field 33 is valid; a write status bit field 35; a read status bit field 36; and a permanent status bit field 37. In similar fashion, the second entry 40 includes an address field 41; a first valid bit field 42 for the address stored in address location 41; a data field 43 for storing data; a second valid bit field 44 for the data stored in the data field 43; a write status bit field 45; a read status bit field 46; and a permanent status bit field 47. In another embodiment the presence an active region defined by the pointer indicates the region in which entries are valid until the CAM is filled and LRU replacement begins. Once LRU replacement begins all entries are considered for match.

Figure 3:
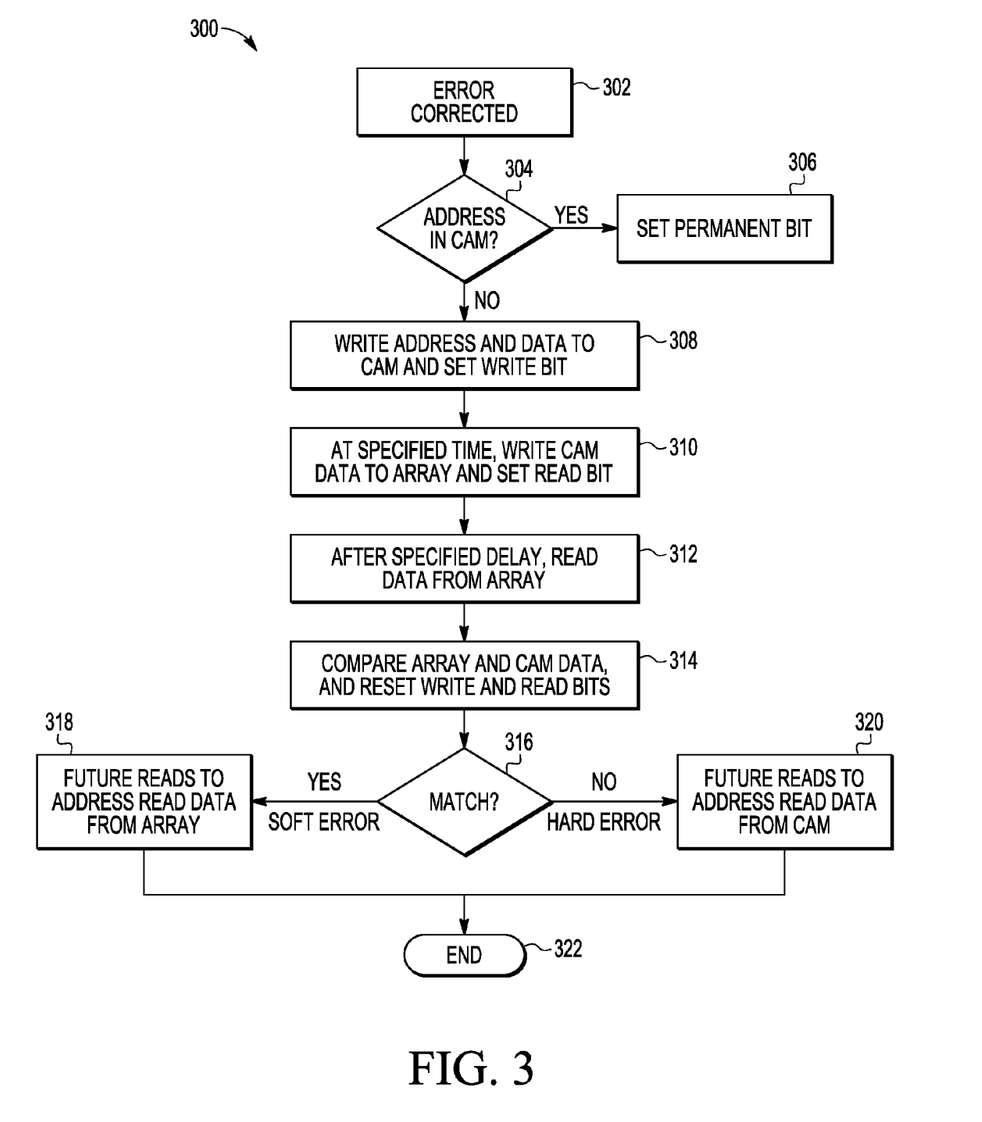
FIG. 3 illustrates a simplified flow chart of a method for processing a data segment with an address where an error has been corrected.

FIG. 3 illustrates a simplified flow chart of a method 300 for processing a data segment with an address where an error has been corrected. For example, the methodology may be used by an ECC memory system 10 (such as shown in FIG. 1) when performing a read operation for a specified address provided by processor 12 on system interconnect 11. As an initial step in the read operation, the control circuit 16 may determine whether there is valid data in CAM 14 at the specified address. If so, the valid data is read from the CAM 14 through the multiplexer 20 and output driver 22 and onto the bus interconnect 11 under control of the control circuit 16. If not, the data is read from main memory array 18 at the specified address provided by control logic 16 which performs ECC correction on the retrieved data if required. For example, upon determining that there is a correctable error, the control circuit 16 corrects the error at step 302 according to the ECC of logic circuit 16, at which point the corrected output may be output as data through multiplexer 20. In the case of error correction being performed, logic circuit 16 causes multiplexer 20 to select the output from control logic 16 for coupling to output driver 22. However, if the error is uncorrectable, a fault is generated by logic circuit 16 and communicated to processor 12 through system interconnect 11.

Upon correction of a data error, the logic circuit 16 determines if the specified address is in an entry of CAM 14 at step 304. If there is a CAM hit to an address previously stored in the array at any time (affirmative outcome to address detection step 304), the permanent bit is set, and the Read and Write bits are cleared at step 306. The setting of the permanent bit at step 306 is performed regardless of the condition of the Read bit or the Write bit. Once set, the permanent bit indicates that the corresponding CAM entry is always read from the CAM 14.

On the other hand, if there is no hit for the specified address at the CAM (negative outcome to address detection step 304), then the specified address and corrected data are loaded into a CAM entry and the corresponding write status bit is set at step 308. For example, the control logic 16 may access the pointer 15 which points to the first unused or least recently used entry in the CAM 14, and then load the specified address and corrected data into the address and data field of the available entry. At this time, any corresponding valid bit(s) for the address and data fields are set to the valid state by control logic 16.

To remove data segments having soft errors from the CAM 14, selected CAM entries are periodically written back to the memory array and then compared after a specified delay (selected to allow weak or leaky bits to fail) with the original CAM entry values to detect hard errors (when there is no comparison match) and to detect soft errors (when there is a comparison match) so that the CAM status bits can be configured to identify CAM entries having hard errors by setting the corresponding permanent status bit. In selected disclosed embodiments, the identification of soft errors is performed with a first data write step 310 where corrected data from selected CAM entries is written to corresponding addresses on the memory array, at which time the write bit for that entry is reset and the read bit for that entry is set. In selected embodiments, the data write step 310 may be performed periodically by the logic circuit 16 or at any specified time by accessing the CAM 14 to identify entries having their write status bit set, and then outputting the corrected data values from each identified entry through multiplexer 20 and output driver 22 to the system interconnect 11 for a write operation to the memory array 18. To track the status of the entry, the logic circuit 16 then sets the read status bit in the CAM 14 for each data entry that is written to the memory array, at which point the write status bit may also be reset.

After the first data write step 310, a predetermined delay time period is allowed to expire before reading back the data from the memory array at step 312. The predetermined delay time period is selected to allow the weak or leaky bits to fail, and may be implemented with a timer circuit, counter circuit, or similar coded program functionality under control of the logic circuit 16. To implement the read back step 312, the logic circuit 16 may be configured to retrieve address information for each entry in the CAM 14 having a set read status bit, and then read the data from main memory 18 at the retrieved address.

At step 314, the data retrieved from the array at step 312 is compared to the corresponding corrected data from the CAM to determine if there is a match at step 316. In selected embodiments, the logic circuit 16 may implement the comparison and match steps 314, 316 by identifying entries in the CAM 14 having the read bit set, and then using the stored CAM addresses from the identified entries to read data from the memory array 18 using the stored CAM addresses. After reading the data from the memory array 18, the logic circuit 16 resets the corresponding read status bits and write status bits in the CAM 14, and the retrieved array data is compared to the CAM data at the logic circuit 16. In selected DRAM embodiments, the predetermined delay time period for writing a CAM entry to the main memory array is a first refresh cycle, and the fixed delay comparing the retrieved array data is approximately the period between refresh cycles so the retrieved array data is compared to the CAM data at a second refresh cycle. As will be appreciated, in selected embodiments where the predetermined delay is the time between DRAM refreshes, this time delay may be specified by DRAM manufacturers, but more generally may be determined by memory characterization for a given array design.

If there is match between the retrieved array data and corresponding CAM data at a specified address (affirmative outcome to match detection step 316), this indicates that the original error was a soft error that is not permanent. In this case, future read operations to the specified address are directed to address read data from the memory array at step 318. In selected embodiments, the logic circuit 16 may implement step 318 by leaving the write, read, and permanent status bits as reset bits. As a result, the address remains in the CAM 14 until it is the least recently used entry and replaced.

On the other hand, if the retrieved array data at a specified address does not match the corresponding CAM data (negative outcome to match detection step 316), this indicates that the original error was a hard error. In this case, future read operations to the specified address are directed to address read data from the CAM at step 320. In selected embodiments, the logic circuit 16 may implement step 320 by setting the permanent bit and leaving the write and read bits as reset bits. Once set, the permanent status bit for an entry indicates that the corresponding CAM entry is always read from the CAM 14. At step 322, the method ends. It will be appreciated that, after power-up, there is a very low probability of having both a soft error hit and a hard error in a data segment before it is read and entered into the CAM with the permanent bit set, so single bit error correction will handle almost all occurrences.

Figure 4:
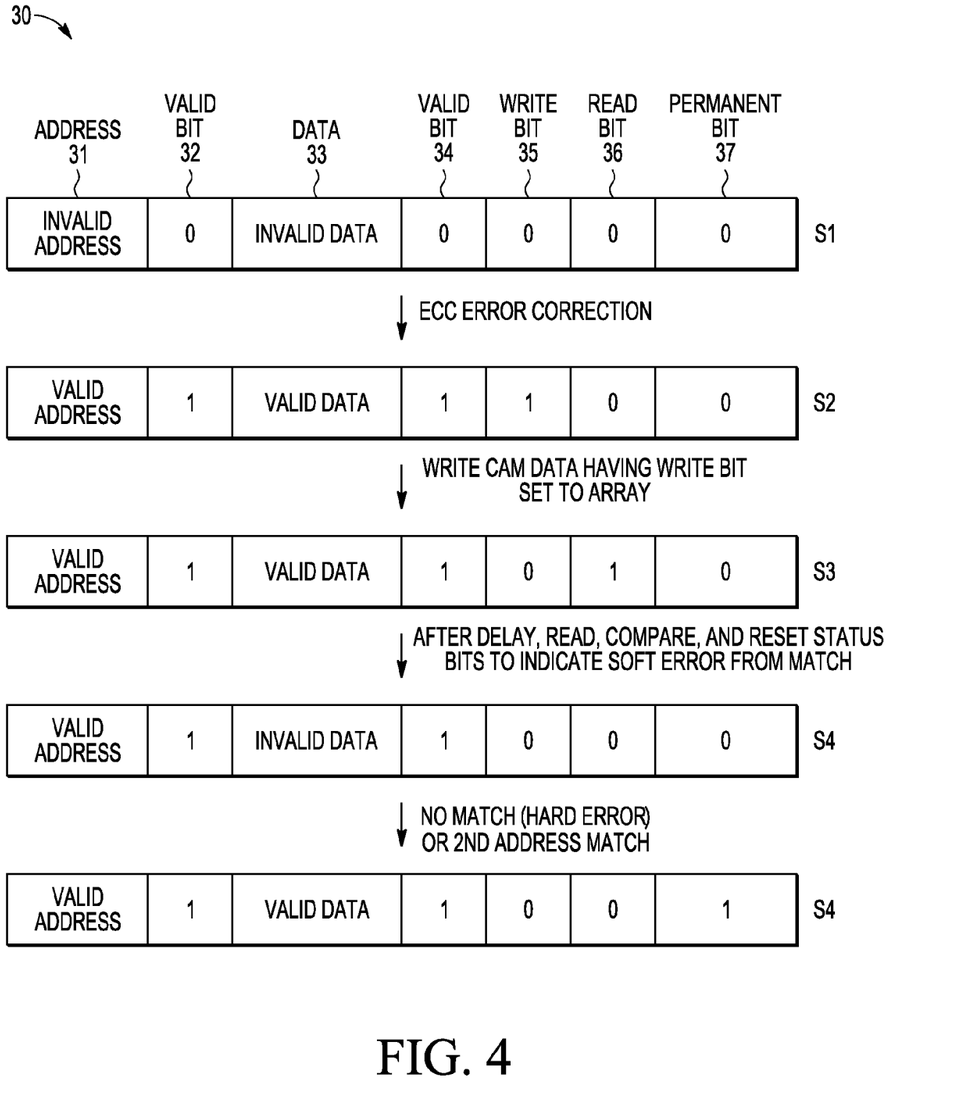
FIG. 4 illustrates is a diagram of an entry in the portion of FIG. 2 shown in a sequence of processing states.

Turning now to FIG. 4, there is shown a diagram of an entry 30 in the CAM 14 of FIG. 2 over a sequence of processing states S1-S5 for the case with a valid bit and where a CAM entry replaces a location in main memory 18 and is evaluated for the type of error using write, read, and permanent status bits. Entry 30 begins at an initial state S1 with an invalid address at address field 31, valid bit field 32 reset to indicate that the address stored in address field 31 is invalid, invalid data at data field 33, and valid bit field 34 reset to indicate that the data stored in data field 33 is invalid. In addition, entry 30 includes write status bit field 35, read status bit field 36, and permanent status but field 37 which are all initially reset. State S2 occurs when entry 30 stores an address of a location in main memory where data from that location underwent error correction, along with the corrected data after ECC error correction is performed. In State S2, a valid address is stored in address field 31, the valid bit 32 is set to indicate that the address stored in address location 31 is valid, the ECC corrected data is stored in the data field 33, and the valid bit 34 is set to indicate the data in data location 33 is valid. In addition, the write status bit field 35 is set while the read status bit field 36 and permanent status bit field 37 remain reset. State 2 occurs when entry 30 has a valid address and valid data, and entry 30 replaces a location in main memory 18. In state S3, the ECC corrected data from the CAM entry 30 having its write status bit set is written to the memory array at the corresponding address from the address field, at which point the write status bit field 35 is reset and the read status bit field 36 is set. State 4 occurs after a predetermined delay from the array write operation that is controlled to allow weak bits to fail, after which time the data for entries with the set read status bits are read from the memory array using corresponding address from the address field. In state S4, the read status bit field 36 is reset, and the read array data is compared to the CAM data. By resetting the read status bit field 36 at state S4, the control logic circuit 16 preemptively configures the status bits to indicate that there has been a match between the read array data and the corresponding CAM data, thereby indicating that a soft error was established. As a result, the address at state S4 is valid for use in performing a comparison to detect a repeat failure of data at the address (resulting in state S5), but the CAM data is not valid since the valid data is in the array. However, if the comparison of the read array data and CAM data does not match, this indicates that the error was a hard error, in which case the permanent status bit field 37 is set at state S5. If the permanent status bit field 37 for the entry 30 is set, the data will always be read from the CAM 14. If an address match occurs within any valid entry in any of the states S1-S4, state S5 results.

Figure 5:
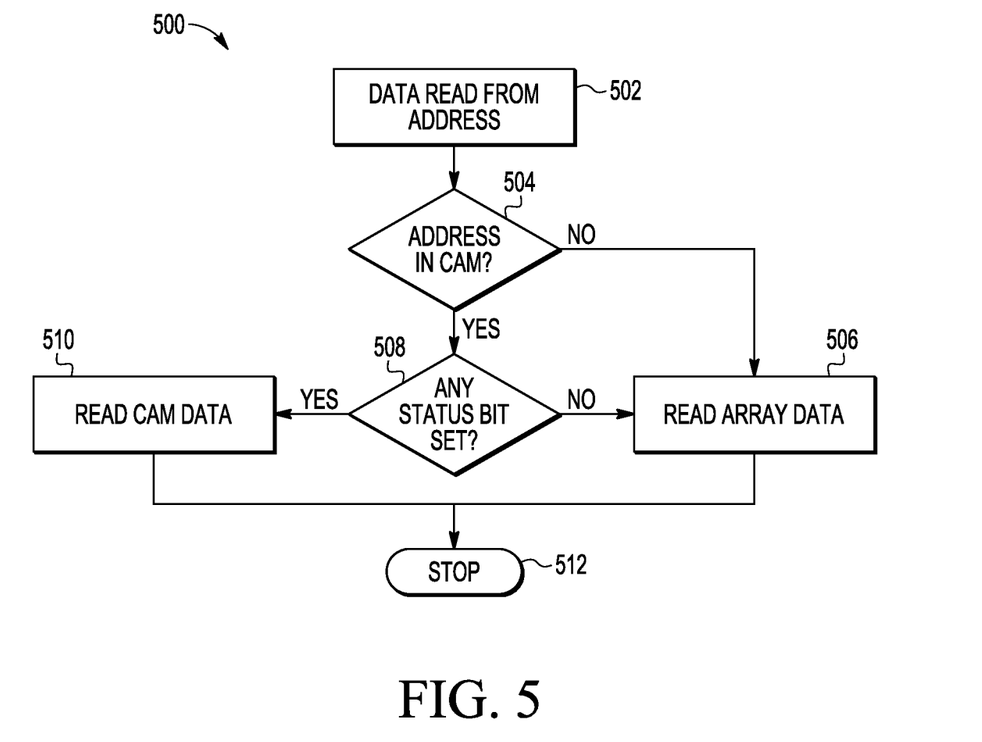
FIG. 5 illustrates a simplified flow chart of a method for reading data from the ECC memory system.

Turning now to FIG. 5, there is shown a simplified flow chart of a method 500 for reading data from the ECC memory system. As an initial step, data is read from the main memory array at step 502 in response to the current address provided by control logic 16. At step 504, it is determined if the current address is in the CAM 14. If the current address is not present in CAM 14 (negative outcome to address detection step 504), the data is read from the main memory array at the current address at step 506. The logic control circuit 16 may be used at step 504 to determine if the current address is in the CAM 14. In addition, the logic control circuit 16 may determine that the current address is stored in the CAM 14 (affirmative outcome to address detection step 504), in which case the logic control circuit 16 may interact with CAM 14 to determine if any of the control status bits (e.g., the write, read, and permanent bits) are set at step 508. If none of the control status bits are set (negative outcome to status bit detection step 508), this indicates that the corresponding CAM data entry is not being used to replace a hard error in the memory array, so the data may be read from the main memory array at the current address at step 506. However, if any of the control status bits are set (affirmative outcome to status bit detection step 508), this indicates that the read operation should use the CAM data entry at step 510. For example, if the write status bit field is set, this indicates that a soft error may be present in the main memory array at the corresponding address. Stated another way, the write bit implies a deferred write. In addition, if the read status bit field is set, this indicates that the status of the array data is not yet determined as the comparison of the CAM data to the array data has not yet been done and the array address may be to a data with hard failure. Stated another way, the read bit implies a deferred read. And if the permanent status bit field is set, this indicates that a hard error is be present in the main memory array at the corresponding address. At step 512, the read operation ends.

By now it should be appreciated that there is provided herein an error correction method and associated memory apparatus having a first memory (e.g., DRAM or SRAM) and second memory, such as a CAM for storing a plurality of entries, each comprising an address field, a data field, a write status bit field, a read status bit field, and a permanent status bit field. In the disclosed methodology, a read operation of the first memory is initiated to retrieve data from a specified address, and an error correction code (ECC) process is performed on the data to detect if the data is erroneous and to provide corrected data. The corrected data may be output to the data processor. After performing the ECC process, a determination is made whether the specified address for the corrected data is stored in the second memory. If not, the specified address and corrected data are stored in the second memory in an available entry and a first or write status bit for the available entry in the second memory is set. However, if the specified address is stored in the second memory, a second or permanent status bit for an entry in the second memory containing the specified address is set. In other embodiments, a data correction by the ECC process causes the specified address and corrected data to be stored in the second memory in an available entry, at which time a first/write status bit is set for the available entry in the second memory. At a first predetermined time after storing the specified address and corrected data in the second memory, the corrected data is written to the specified address at the first memory. At a second predetermined time after writing the corrected data to the specified address at the first memory, the corrected data from the second memory is compared to data from the first memory stored at the specified address, at which time the first/write status bit for the available entry in the second memory is reset. In selected embodiments, a third or read status bit for the available entry in the second memory may be set upon writing the corrected data to the specified address at the first memory, and the third/read status bit for the available entry in the second memory may be reset upon comparing the corrected data from the second memory with the data from the first memory. In selected DRAM embodiments, the corrected data from the available entry in the second memory may be stored to the first memory in a first DRAM refresh cycle for the first memory, and the retrieved data from the first memory may be compared to the corrected data stored in the second memory in a second DRAM refresh cycle for the first memory. The second predetermined time may be selected as a specified minimum duration to allow weak or leaky bits in the first memory to fail. If the corrected data from the second memory matches the data from the first memory stored at the specified address, data from the first memory is provided as read data in response to a subsequent read operation directed to the specified address. However, if the corrected data from the second memory does not match the data from the first memory stored at the specified address, a permanent status bit for an entry in the second memory containing the specified address is set, and data from the second memory is provided as read data in response to a subsequent read operation directed to the specified address so that subsequent read operations to the specified address are always read from the second memory when the second status bit for the specified address is set as the permanent status bit.

In another form, there is provided an error correction code (ECC) memory and associated method of operation. In the disclosed ECC memory, first and second memories are provided. The first memory (e.g., a RAM array) may be organized in an array of rows and columns for addressing, reading, and storing or writing data bits. The second memory (e.g., a CAM) may be organized as a plurality of entries for storing data, each entry comprising an address value, data value, read bit, write bit, and permanent bit. The ECC memory also includes an error correction control circuit for performing error correction on data stored in the first memory at a specified address to generate corrected data, and for storing the corrected data and specified address in an entry in the second memory along with specified values for the read bit, write bit, and permanent bit in said entry. In selected embodiments, the error correction control circuit includes control logic for performing ECC processing on data read from a specified address at the first memory to detect if the data is erroneous and to provide corrected data. The ECC circuit control logic may also store the specified address and corrected data in the second memory in an available entry and set the write bit for the available entry in the second memory. In addition, the ECC circuit control logic may also be used to compare the corrected data stored in the second memory to data from the first memory stored at the specified address after waiting a predetermined time after storing the specified address and corrected data in the first memory to determine if there is a comparison match. If the corrected data matches the data from the first memory stored at the specified address, the ECC circuit control logic may provide read data from the first memory in response to a subsequent read operation directed to the specified address. However, if the corrected data does not match the data from the first memory stored at the specified address, the ECC circuit control logic may set a permanent bit for an entry in the second memory containing the specified address and provide read data from the second memory in response to a subsequent read operation directed to the specified address. In operation, the ECC circuit control logic may compare the corrected data stored in the second memory to data from the first memory stored at the specified address by first storing the corrected data from the available entry in the second memory to the first memory at the specified address and setting the read bit for the available entry in the second memory. Subsequently, the ECC circuit control logic reads retrieved data from the first memory at the specified address after the predetermined time has expired, and compares the retrieved data from the first memory to the corrected data stored in the second memory and reset the read bit for the available entry in the second memory. In this arrangement, the read bit being set indicates an undetermined status of the data stored in the first memory at the specified address, the write bit being set indicates that the data stored in the first memory at the specified address may have a soft error, and the permanent bit being set indicates that the data stored in the first memory at the specified address has a hard error.

In yet another form, there is provided an ECC memory system for providing hard and soft error detection and management. The disclosed system includes a means (e.g., ECC memory system having a processor) for initiating a read operation of a first memory to retrieve data from a specified address. The disclosed system also includes a means (e.g., ECC memory system having a logic control circuit with ECC) for performing an error correction code (ECC) process on the data to detect if the data is erroneous and to provide corrected data. In addition, the disclosed system includes a means (e.g., ECC memory system having a logic control circuit) for storing the specified address and corrected data in a second memory and setting a write status bit associated with the specified address and corrected data to indicate that data stored in the first memory at the specified address may have a soft error. The disclosed system also includes a means (e.g., ECC memory system having a logic control circuit) for determining if data stored in the first memory at the specified address has a hard error by comparing the corrected data stored in the second memory to data from the first memory stored at the specified address after waiting a predetermined time after storing the specified address and corrected data in the first memory to determine if there is a not a comparison match, in which case the permanent status bit is set to indicate that the data stored in the first memory at the specified address has a hard error. In selected embodiments of the disclosed system, the first memory is a random access memory, and the second memory is a content addressable memory (CAM) organized as a plurality of entries, each for storing corrected data along with a corresponding specified address, write status bit to indicate whether there is a soft error in the data stored in the first memory at the specified address, read status bit to indicate whether there is an undetermined status for the data stored in the first memory at the specified address, and permanent status bit to indicate whether there is a hard error in the data stored in the first memory at the specified address.

Although the described exemplary embodiments disclosed herein are directed to various ECC memory systems and method for using status control bits to detect and manage hard and soft errors, the present invention is not necessarily limited to the example embodiments which illustrate inventive aspects of the present invention that are applicable to a wide variety of information processing systems and circuits. Thus, the particular embodiments disclosed above are illustrative only and should not be taken as limitations upon the present invention, as the invention may be modified and practiced in different but equivalent manners apparent to those skilled in the art having the benefit of the teachings herein. For example, although FIG. 1 and the discussion thereof describe an exemplary information processing architecture, this exemplary architecture is presented merely to provide a useful reference in discussing various aspects of the invention, and is not intended to be limiting so that persons of skill in the art will understand that the principles taught herein apply to other types of devices. For example, selected embodiments may implement the illustrated elements of system 10 on a single integrated circuit or within a same device. Alternatively, system 10 may include any number of separate integrated circuits or separate devices interconnected with each other. For example, processor 12 may be on a different integrated circuit than the other circuit elements shown in FIG. 1. In yet other embodiments, the redundant memory that is described as a CAM may be considered beneficial, but other memory types and other schemes for implementing the redundancy may be found to be effective. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    initiating a read operation of a first memory to retrieve data from a specified address;
    performing an error correction code (ECC) process on the data to detect if the data is erroneous and to provide corrected data;
    storing the specified address and corrected data in a second memory in an available entry and setting a first status bit for the available entry in the second memory;
    at a first predetermined time after storing the specified address and corrected data in the second memory, writing the corrected data to the specified address at the first memory;
    at a second predetermined time after writing the corrected data to the specified address at the first memory, comparing the corrected data from the second memory with the data from the first memory stored at the specified address and resetting the first status bit for the available entry in the second memory;
    if the corrected data from the second memory matches the data from the first memory stored at the specified address, providing data from the first memory as read data in response to a subsequent read operation directed to the specified address; and
    if the corrected data from the second memory does not match the data from the first memory stored at the specified address, setting a second status bit for an entry in the second memory containing the specified address and providing data from the second memory as read data in response to a subsequent read operation directed to the specified address.

2. The method of claim 1, further comprising:
    determining if the specified address for the corrected data is stored in the second memory after performing the ECC process;
    if the specified address is not stored in the second memory, storing the specified address and corrected data in the second memory in an available entry and setting the first status bit as a write status bit for the available entry in the second memory; and
    if the specified address is stored in the second memory, setting the second status bit as a permanent status bit for an entry in the second memory containing the specified address.

3. The method of claim 2, wherein subsequent read operations to the specified address are always read from the second memory when the second status bit for the specified address is set as the permanent status bit.

4. The method of claim 1, wherein the first memory is one of either a dynamic random access memory (DRAM) or a static random access memory (SRAM).

5. The method of claim 1, where the second predetermined time is a specified minimum duration that is selected to allow weak or leaky bits in the first memory to fail.

6. The method of claim 1, where the second memory comprises a content addressable memory (CAM) for storing a plurality of entries, each comprising an address field, a data field, a write status bit field, a read status bit field, and a permanent status bit field.

7. The method of claim 1, further comprising:
    setting a read status bit for the available entry in the second memory upon writing the corrected data to the specified address at the first memory; and
    resetting the read status bit for the available entry in the second memory upon comparing the corrected data from the second memory with the data from the first memory.

8. The method of claim 7, where the corrected data from the available entry in the second memory is stored to the first memory in a first DRAM refresh cycle for the first memory, and where the retrieved data from the first memory is compared to the corrected data stored in the second memory in a second DRAM refresh cycle for the first memory.

9. The method of claim 1, further comprising outputting the corrected data to a data processor.

10. An error correction code (ECC) memory comprising:
    a first memory organized in an array of rows and columns for addressing data bits for read and write operations;
    a second memory organized as a plurality of entries for storing data, each entry comprising an address value, data value, read bit, write bit, and permanent bit; and
    an error correction control circuit for performing error correction on data stored in the first memory at a specified address to generate corrected data, and for storing the corrected data and specified address in an entry in the second memory along with specified values for the read bit, write bit, and permanent bit in said entry.

11. The ECC memory of claim 10, where the first memory comprises a random access memory array organized in rows and columns to be addressed for read and write operations.

12. The ECC memory of claim 10, where the second memory comprises a content addressable memory (CAM).

13. The ECC memory of claim 10, where the error correction control circuit comprises control logic for performing error correction code (ECC) processing on data read from a specified address at the first memory to detect if the data is erroneous and to provide corrected data; and for storing the specified address and corrected data in the second memory in an available entry and setting the write bit for the available entry in the second memory.

14. The ECC memory of claim 13, where the error correction control circuit further comprises control logic for comparing the corrected data stored in the second memory to data from the first memory stored at the specified address after waiting a predetermined time after storing the specified address and corrected data in the first memory to determine if there is a comparison match.

15. The ECC memory of claim 14, where the error correction control circuit further comprises control logic for providing data from the first memory as read data in response to a subsequent read operation directed to the specified address if the corrected data matches the data from the first memory stored at the specified address.

16. The ECC memory of claim 14, where the error correction control circuit further comprises control logic for setting a permanent bit for an entry in the second memory containing the specified address if the corrected data does not match the data from the first memory stored at the specified address and providing the corrected data as read data from the second memory in response to a subsequent read operation directed to the specified address.

17. The ECC memory of claim 14, where the control logic for comparing the corrected data stored in the second memory to data from the first memory stored at the specified address is configured to:

store the corrected data from the available entry in the second memory to the first memory at the specified address and set the read bit for the available entry in the second memory;

read retrieved data from the first memory at the specified address after the predetermined time has expired; and compare the retrieved data from the first memory to the corrected data stored in the second memory and reset the read bit for the available entry in the second memory.

18. The ECC memory of claim 17, where the read bit being set indicates an undetermined status of the data stored in the first memory at the specified address, write bit being set indicates that the data stored in the first memory at the specified address may have a soft error, and permanent bit being set indicates that the data stored in the first memory at the specified address has a hard error.

19. A system comprising:

means for initiating a read operation of a first memory to retrieve data from a specified address;

means for performing an error correction code (ECC) process on the data to detect if the data is erroneous and to provide corrected data; and means for storing the specified address and corrected data in a second memory and setting a write status bit associated with the specified address and corrected data to indicate that data stored in the first memory at the specified address may have a soft error; and means for determining if data stored in the first memory at the specified address has a hard error by comparing the corrected data stored in the second memory to data from the first memory stored at the specified address after waiting a predetermined time after storing the corrected data to the specified address at the first memory to determine if there is a not a comparison match, in which case the permanent status bit is set to indicate that the data stored in the first memory at the specified address has a hard error.

20. The system of claim 19, where the first memory is a random access memory, and where the second memory comprises a content addressable memory (CAM) organized as a plurality of entries, each for storing corrected data along with a corresponding specified address, write status bit to indicate whether there is a soft error in the data stored in the first memory at the specified address, read status bit to indicate whether there is an undetermined status for the data stored in the first memory at the specified address, and permanent status bit to indicate whether there is a hard error in the data stored in the first memory at the specified address.

\* \* \* \* \*